(12) United States Patent
Kerger et al.

(10) Patent No.: US 10,862,291 B2
(45) Date of Patent: Dec. 8, 2020

(54) DIFFERENTIAL PROTECTION METHOD, DEVICE AND SYSTEM FOR MONITORING A LINE OF AN ELECTRICAL ENERGY SUPPLY NETWORK

(71) Applicant: SIEMENS AKTIENGESELLSCHAFT, Munich (DE)

(72) Inventors: Torsten Kerger, Schoenwalde-Glien (DE); Robert Matussek, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 157 days.

(21) Appl. No.: 16/106,333

(22) Filed: Aug. 21, 2018

(65) Prior Publication Data
US 2019/0067928 A1    Feb. 28, 2019

(30) Foreign Application Priority Data
Aug. 22, 2017    (EP) .................................. 17187273

(51) Int. Cl.
*H02H 1/04*    (2006.01)
*H02H 3/28*    (2006.01)
(Continued)

(52) U.S. Cl.
CPC ............ *H02H 1/046* (2013.01); *H02H 3/283* (2013.01); *H02H 7/263* (2013.01); *G01R 15/183* (2013.01); *G01R 19/10* (2013.01)

(58) Field of Classification Search
CPC .. G01R 19/00; G01R 19/2513; G01R 22/063; G01R 27/16; G01R 27/2611;
(Continued)

(56) References Cited

U.S. PATENT DOCUMENTS 4,280,093 A * 7/1981 Houston .............. G01R 19/175
324/117 R
5,619,392 A    4/1997 Bertsch et al.
(Continued)

FOREIGN PATENT DOCUMENTS

DE    19802831 A1    8/1998
DE    19928192 A1    12/2000
(Continued)

*Primary Examiner* — Vinh P Nguyen
(74) *Attorney, Agent, or Firm* — Laurence Greenberg; Werner Stemer; Ralph Locher

(57) ABSTRACT

A differential protection method monitors a line of an electrical energy supply network. Current signals are generated at the ends of the line using inductive current transformers, which current signals are proportional to a current flowing at the respective end. For each end, current measurement values are formed from the respective current signal using measuring devices, which current measurement values indicate a profile of the current flowing at the respective end. For each end, a respective charge value is determined from the current measurement values. The charge values of all the ends are summed to form a charge sum, and a fault signal that indicates an internal fault on the line is generated when the charge sum exceeds a charge threshold value. To perform line differential protection in the case of current transformer saturation, when transformer saturation of a current transformer is present, an estimated charge value is ascertained.

8 Claims, 5 Drawing Sheets

(51) Int. Cl.
*H02H 7/26* (2006.01)
*G01R 15/18* (2006.01)
*G01R 19/10* (2006.01)

(58) Field of Classification Search
CPC ........ G01R 31/50; G01R 31/52; G01R 15/18;
G01R 19/0061; G01R 31/12; G01R
31/308; G01R 31/382; G01R 31/396;
G01R 15/183; G01R 19/10; G06F 1/32;
G06F 19/00; G06F 3/0219; G06F 3/0233;
G06F 3/0237; G06F 3/0238; G08C
2201/10; H02H 1/046; H02H 3/283;
H02H 7/263
See application file for complete search history.

(56) References Cited

U.S. PATENT DOCUMENTS

| | | | |
|---|---|---|---|
| 6,043,641 A * | 3/2000 | Singer | G01R 15/181 |
| | | | 324/115 |
| 6,501,631 B1 | 12/2002 | Wang et al. | |
| 6,563,296 B2 * | 5/2003 | Cooke | G01R 15/18 |
| | | | 324/115 |
| 6,956,363 B2 | 10/2005 | Kerger et al. | |
| 7,103,485 B2 | 9/2006 | Kang et al. | |
| 7,636,396 B1 * | 12/2009 | Weber, Jr. | H04B 3/546 |
| | | | 324/126 |
| 7,738,221 B2 * | 6/2010 | Kojovic | H02H 7/0455 |
| | | | 361/36 |
| 9,891,289 B2 * | 2/2018 | Kojovic | G01R 19/10 |

FOREIGN PATENT DOCUMENTS

| | | |
|---|---|---|
| DE | 19959776 A1 | 6/2001 |
| EP | 0688078 A2 | 12/1995 |
| WO | 2008145694 A1 | 12/2008 |

* cited by examiner

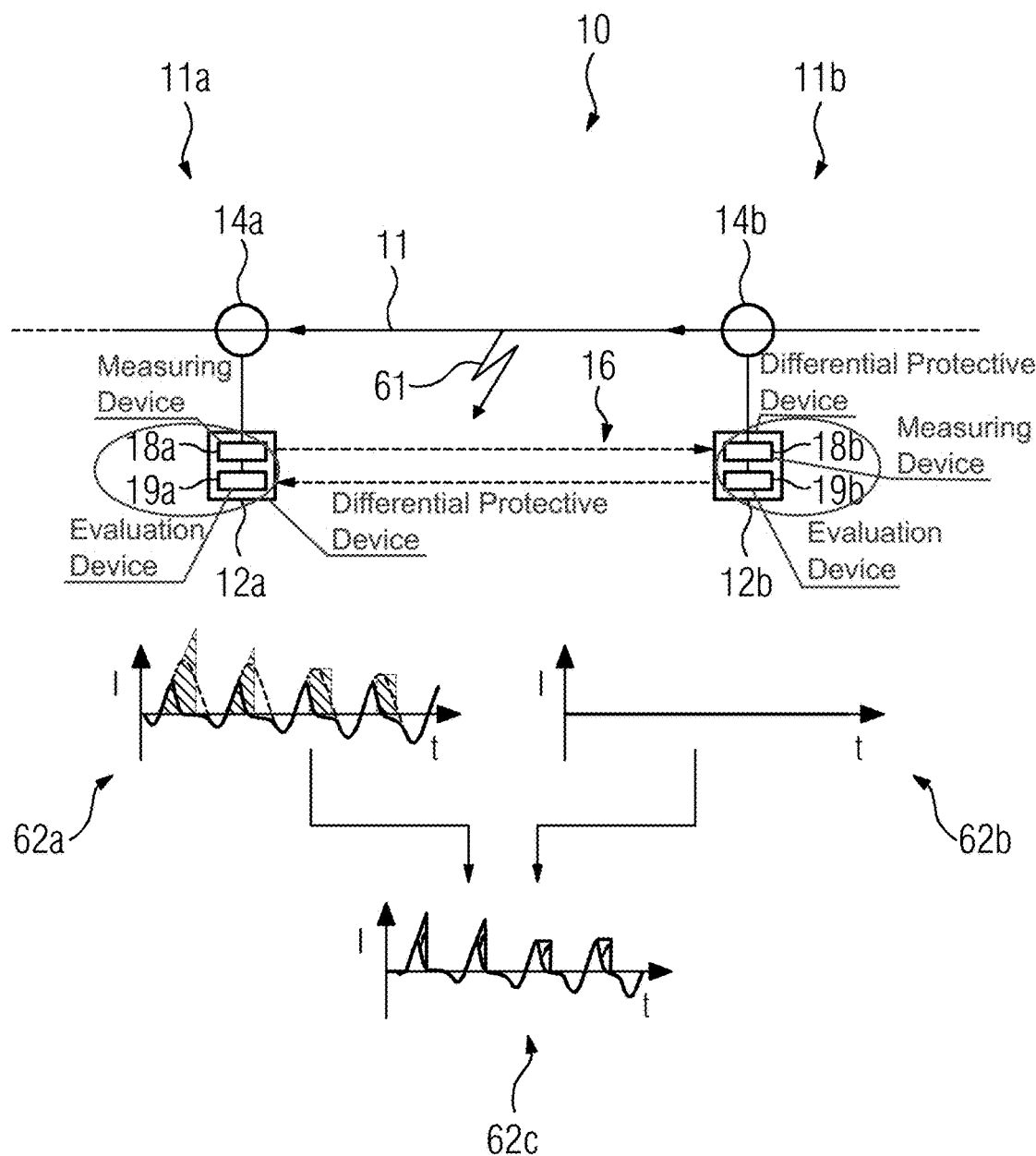

DIFFERENTIAL PROTECTION METHOD, DEVICE AND SYSTEM FOR MONITORING A LINE OF AN ELECTRICAL ENERGY SUPPLY NETWORK

CROSS-REFERENCE TO RELATED APPLICATION

This application claims the priority, under 35 U.S.C. § 119, of European application EP 17187273.2 filed Aug. 22, 2017; the prior application is herewith incorporated by reference in its entirety.

BACKGROUND OF THE INVENTION

Field of the Invention

The invention relates to a differential protection method for monitoring a line of an electrical energy supply network, in which method current signals are generated at the ends of the line using inductive current transformers. The current signals are proportional to a current flowing at the respective end, for each end, current measurement values are formed from the respective current signal using measuring devices. The current measurement values indicate a profile of the current flowing at the respective end, for each end, a respective charge value is determined from the current measurement values. The charge values of all the ends are summed with the correct mathematical sign so as to form a charge sum, and a fault signal that indicates an internal fault on the line is generated when the charge sum exceeds a charge threshold value. The invention also relates to a differential protective device and to a differential protective system.

To monitor high-voltage and medium-voltage lines, for example overhead lines or cables, of electrical energy supply networks, a current differential protection method (referred to hereinafter as "differential protection method" for the sake of simplicity) is often used. In this case, the current flowing at the ends of the monitored line is detected so as to form current measurement values and fed to a differential protective device. The differential protective device checks, based on the detected current measurement values, whether a permissible operating state or a fault is present.

To this end, difference current values can be determined, for example, by vectorial addition and subsequent absolute value formation from current phasor measurement values formed using the current measurement values. In the fault-free case, the difference current values are in a range close to zero since in this case—in simple terms—the current flowing into the component also flows out of it again in full. In contrast, if difference current values that exceed a threshold value other than zero result, the difference current values permit an operating state that is afflicted with faults, for example an internal fault, to be inferred. A distinction is made between internal faults and external faults. Internal faults are located within the protective region between the current transformers and have to be disconnected. External faults are located outside of the region to be protected and do not have to lead to disconnection.

In the case of an internal fault, the present fault current has to be interrupted by opening switching devices, for example circuit breakers, that delimit the line. For this purpose, the differential protective device generates a corresponding fault signal, as a result of which the generation of a switching signal for the respective switching device can be permitted.

One embodiment of the differential protection is charge differential protection. In this case, the current is not summed as a phasor value. Instead, the temporal integral of the current, the charge, is used to perform the summing. Kirchhoff's second law (nodal rule) also applies to charge measurement values. An integration interval of ¼ of a network period is used to obtain charge values Q(t) from the temporal profile of the current i(t) in accordance with $$Q(t) = \int_{t_1}^{t_2} i(t)dt.$$

In contrast to phasor values, the charge is a scalar value and thus independent of the network frequency. An example of a charge differential protective system is known, for example, from published, non-prosecuted German patent application DE 199 59 776 A1, corresponding to U.S. Pat. No. 6,956,363.

In an energy transmission line, the line ends are usually located far apart (up to a few hundred kilometers) from one another so that the current measurement values have to be transmitted over a relatively long path. In such a case, a separate differential protective device is usually arranged at each of the ends of the line, which separate differential protective device forms the respective difference current value from the discrete (locally detected) current measurement values and the current measurement values received from the other end of the line. In the case of a line having a plurality of ends, for example a branched line, current measurement values from each of the ends are also required in order to be able to perform the differential protection method correctly. To this end, the current measurement values detected locally at the respective measurement locations have to be transmitted between the individual differential protective units.

To assess the operating situation of the line, current measurement values from at least two different measurement locations at the respective ends of the monitored line are consequently necessary.

In existing differential protective systems, the current measurement values are often transmitted via a hardwired point-to-point connection (for example copper or glass-fiber lines), as a result of which deterministic transmission is achieved, that is to say the transmission time of the measurement values is mainly dependent on the transmission path and the type of transmission and is substantially constant. In more recent differential protective systems, there has now been a change to transmitting the current measurement values via a communications network, for example a telecommunications network or a data communications network based on the IP protocol instead of via a hardwired connection. This has the advantage of a more cost-effective communications infrastructure. Moreover, communications networks are often already present close to primary electrical components, for example between what are known as substations of an energy supply network, and can be used for the transmission of the current measurement values without additional costs.

To detect the current measurement values, conventional current transformers are often used to convert the comparatively high alternating electric currents to lower alternating electric currents so that they can be processed by the electrical differential protective units. Conventional electrical current transformers in this case comprise a transformer core composed of a magnetizable material (for example iron alloys or steel), which are in magnetic interaction with a primary conductor and a secondary conductor. A core of this kind is often designed as what is known as a ring core, which forms a ring around the primary conductor. In this case, the secondary conductor is wound with a certain number of windings around the transformer core.

The comparatively high alternating current flows through the primary conductor. The comparatively high alternating current induces a magnetic field in the transformer core, which magnetic field in turn induces in the secondary conductor a lower alternating current in accordance with the transformer transformation ratio, the level of which lower alternating current is usually proportional to the level of the primary current.

However, on account of the magnetic properties of the transformer core, what is known as transformer saturation can occur in the case of high primary-side currents or large DC components in the alternating current, as a result of which the profile of the secondary current is no longer proportional to the profile of the primary current and the measurement values detected on the secondary side of the current transformer are thus disturbed by the current transformer saturation.

If current transformer saturation occurs at one or more of the affected line ends, the sum of the primary currents is not transmitted proportionally onto the secondary sides to the protective unit. The measurement of the differential protection is significantly disturbed, with the result that undesired hyperfunctions, for example faulty tripping phenomena of a circuit breaker, in the case of external faults, or non-response in the case of internal faults can occur. Such faulty tripping phenomena are associated with high costs for operators of the electrical energy supply network on account of the power failures associated therewith. In the case of undesired non-response, damage to the primary technology can occur.

Depending on the time at which the saturation of the current transformer starts after a saturation-free time, a differential protective system can identify the fault as an internal fault or an external fault in advance. If this is unsuccessful up until the onset of the saturation, the measurement values arising now make it possible to separate between internal and external faults with difficulty.

In order to avoid faulty functions of electrical units, which perform further processing of the measurement values, methods are used to automatically identify secondary current profiles that have been disturbed by current transformer saturation and to perform appropriate correction of the disturbed values. A method of the type mentioned above is known, for example, from U.S. Pat. No. 7,103,485 B2. In the known method, measurement values of a secondary current profile of a current transformer are detected and checked for possibly present saturation. When current transformer saturation is identified, a magnetizing current is calculated at the start time of the current transformer saturation, using which magnetizing current a magnetic flux in the transformer core present at the start time is determined. Using characteristic curves that are characteristic of the specific current transformers and that indicate a correlation between the magnetic flux and the secondary current, the measurement values disturbed by saturation of the current transformer are corrected after the start time in order to obtain a corrected profile of the measurement values of the secondary current through compensation of the disturbance due to current transformer saturation. However, the required characteristic curves that are characteristic of the corresponding current transformer are often obtainable only with difficulty or even not available at all and have to be generated first by complex measurements.

International patent disclosure WO 2008/145694 A1 also discloses correction of the current profile disturbed by current transformer saturation using past current measurement values and reconstruction of the expected current profile.

It is also known to perform stabilization of the differential protection by virtue of accordingly increasing the charge threshold value used for the evaluation of the charge sum. Alternatively, when transformer saturation is present, the differential protection identification can also be blocked completely in order to avoid faulty tripping phenomena. Both variants have disadvantages, which can be noticed, in particular, in the difference between internal faults (to be disconnected) and external faults (not to be disconnected). Stabilization of the measuring system leads to reduced sensitivity in the case of internal faults, which can no longer be identified in some circumstances as a result of this. The blocking of the measuring system leads to non-identification of internal faults and subsequent faults.

SUMMARY OF THE INVENTION

The invention is based on the object of being able to perform line differential protection in a simple manner as reliably as possible even in the case of current transformer saturation.

This object is achieved by way of a method of the type mentioned at the beginning, in which, when transformer saturation of a current transformer is present, an estimated charge value is ascertained using the corresponding measuring device and the estimated charge value is used to form the charge sum.

An advantage of the method according to the invention consists in that faults on the line can be identified reliably without the need for significant stabilization or blocking of the differential protection, since an estimated charge value is used instead of the charge value that is distorted by transformer saturation, the level of which estimated charge value corresponds approximately to the level of the charge value ascertained in the case of a lack of transformer saturation. This can largely compensate for the measurement errors that are produced due to transformer saturation.

An advantageous configuration of the method according to the invention makes provision for a temporal integral over the current measurement values of the respective end of the line to be formed during a prescribed time interval to form the respective charge value.

Through integration or summing of the individual current measurement values, the charge can be determined as the area under the curve of a current-time graph. For example, a quarter-period or a half-period of the network frequency can be used as the time interval.

According to an advantageous embodiment of the method according to the invention, there may be provision for the estimated charge value to be ascertained using at least one current measurement value present at the onset time of the transformer saturation.

In this way, the estimated charge value can be ascertained comparatively simply and using measurement values that are present anyway.

Specifically, there may be provision in this context for a straight line that passes on the one hand through the current measurement value at the onset time of the transformer saturation and on the other hand through the last zero crossing of the current profile to be determined to ascertain the estimated charge value and for the estimated charge value to be determined as the area lying within the time interval between the straight line and the zero line.

In this way, the estimated charge value can be determined by relatively simple calculations and using just two points in the current profile. This estimation is suitable, in particular, for saturation effects that start relatively early, in which the saturation-free time is correspondingly short.

Alternatively, there may also be provision for a rectangle to be formed to ascertain the estimated charge value, one side of which rectangle is determined by the current measurement value at the onset time of the transformer saturation and the other side of which rectangle is determined by the duration of the time interval, and for the estimated charge value to be determined as the area of the rectangle.

In this way, an estimated charge value can be ascertained again using fewer points in the current profile. This procedure is particularly suitable for saturation effects that start relatively late, in which the current profile has already come close to the maximum of the substantially sinusoidal current curve.

A further advantageous embodiment of the method according to the invention makes provision for a difference value between a present current measurement value and a predicted value to be determined to identify the onset time of the transformer saturation, wherein the predicted value indicates an expected profile of the current and for the onset time to be identified when the difference value exceeds a saturation threshold value.

As a result of this, starting transformer saturation can be identified without a particularly large amount of computational outlay. The predicted value can be derived, for example, from the previous profile of the current and, for example, a period can be equated to the current measurement value beforehand. DC components and subsiding effects in the formation of the predicted value can also be taken into account.

In order to take into account the fact that the estimated charge value does not correspond exactly to the charge value that would have been ascertained without transformer saturation, in accordance with a further advantageous embodiment of the method according to the invention, there may be provision for the charge threshold value to be temporarily increased when transformer saturation is present.

However, this form of stabilization can be significantly lower than stabilization that—without formation of an estimated charge value—would have to be started for compensation of the transformer saturation. In this context, the charge threshold value can be, for example, a single scalar value, which is compared with the charge value. Alternatively, a characteristic curve in a tripping diagram can also be used, which separates a tripping region from a normal region for pairs of charge values and stabilization values. A temporary increase in the charge threshold value can be achieved by correspondingly shifting the characteristic curve.

The object mentioned above is also achieved by way of a differential protective device for monitoring a line of an electrical energy supply network. The differential protective device having a measuring device, which is configured to detect a current signal generated at an end of the line and to form current measurement values, which indicate a profile of a current flowing at the respective end. The current signal has been produced proportionally to a current flowing at the end using an inductive current transformer. The differential protective device further having an evaluation device, which is configured to determine a charge value from the current measurement values, to sum the charge values with a charge measurement value of at least one other differential protective device with the correct mathematical sign so as to form a charge sum and to generate a fault signal that indicates an internal fault on the line when the charge sum exceeds a charge threshold value.

There is provision according to the invention for the evaluation device to be configured, when transformer saturation of the current transformer is present, to ascertain an estimated charge value and to use the estimated charge value to form the charge sum.

All of the statements made above and below regarding the method according to the invention accordingly hold true with respect to the device according to the invention and vice-versa; in particular, the device according to the invention is configured to carry out the method according to the invention in any desired embodiment or a combination of desired embodiments. With respect to the advantages of the device according to the invention, reference is also made to the advantages described regarding the method according to the invention.

The object mentioned above is finally also achieved by way of a differential protective system for monitoring a line of an electrical energy supply network, wherein the line has at least two ends.

According to the invention, a measuring device is arranged at each end.

All of the statements made above and below regarding the method according to the invention and the device according to the invention accordingly hold true with respect to the system according to the invention and vice-versa; in particular, the system according to the invention is configured to carry out the method according to the invention in any desired embodiment or a combination of desired embodiments. With respect to the advantages of the system according to the invention, reference is also made to the advantages described regarding the method according to the invention.

The invention will be explained in more detail hereinbelow on the basis of an exemplary embodiment. The specific design of the exemplary embodiment is not to be understood as restricting for the general design of the method according to the invention and the device according to the invention in any way; instead, individual design features of the exemplary embodiment can be combined in any desired manner freely with one another and with the features described above.

Other features which are considered as characteristic for the invention are set forth in the appended claims.

Although the invention is illustrated and described herein as embodied in a differential protection method, differential protective device and differential protective system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 6 is an illustration of a differential protective system in the event of a measurement disturbed by transformer saturation in the case of an internal fault with compensation through use of an estimated charge value.

DETAILED DESCRIPTION OF THE INVENTION

Figure 1:
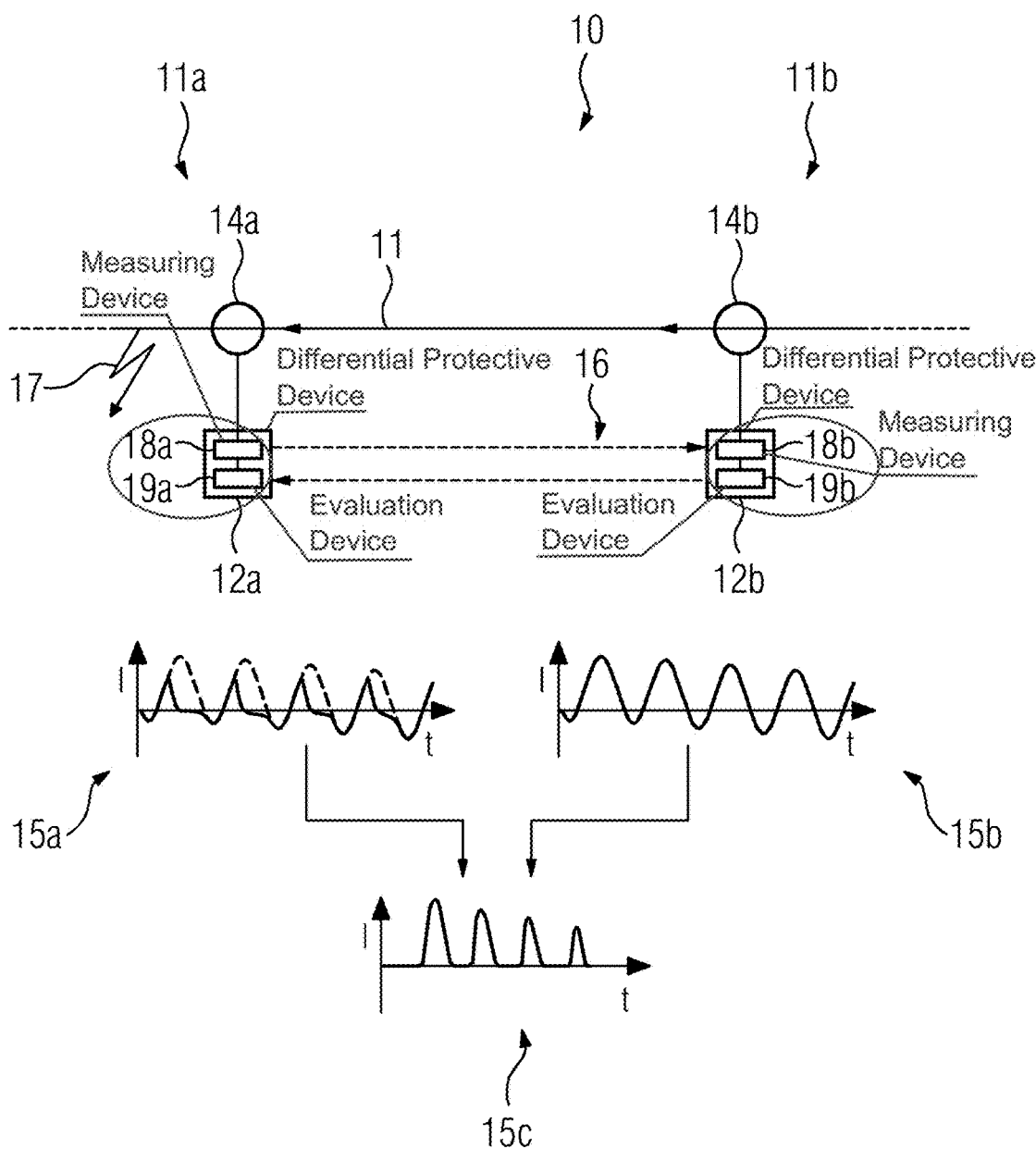
FIG. 1 is an illustration showing a differential protective system in an event of a measurement disturbed by transformer saturation in a case of an external fault.

Referring now to the figures of the drawings in detail and first, particularly to FIG. 1 thereof, there is shown a part 10 of an electrical energy supply network, which is not illustrated in any more detail hereinafter. The part 10 contains an electrical line 11, which can be configured, for example, as three-phase and as an overhead line or as a cable. The line 11 is monitored at its first end 11a by means of a first differential protective device 12a and at its second end 11b by means of a second differential protective device 12b with respect to faults, for example shorts, occurring on the line 11. For this purpose, for each phase of the line 11, current signals are detected at the first end 11a of the line 11 using a current transformer 14a and at a second measurement location at the second end 11b using a current transformer 14b and the current signals are fed to a respective measuring device 18a, 18b of the corresponding differential protective device 12a, 12b. Current measurement values are generated from the analog current signals. The generation of the current measurement values including an analog-to-digital conversion can take place, for example, in the measuring device 18a, 18b of the respective differential protective device 12a, 12b or in a suitable measuring unit, for example, a remote terminal unit (RTU) or a merging unit. Finally, the generated current measurement values are fed to an evaluation device 19a, 19b, for example a CPU or a signal processor, of the respective differential protective device 12a, 12b.

A respective charge value can be formed in the evaluation device of the respective differential protective device 12a, 12b from the current measurement values by way of temporal integration or summation of the current measurement values over a prescribed time interval, for example ¼ period or ½ period of the network frequency, which respective charge value indicates phase-by-phase the amount of charge that has flowed at the respective line end during the time interval.

The differential protective devices 12a and 12b are connected to one another by a communications connection 16, which is illustrated only schematically in FIG. 1, which may be, for example, a hardwired signal line, a telecommunications network or an IP-based communications network. However, any other communications connection of any desired type can also be used to connect the differential protective devices 12a and 12b. The charge values from the respective other end 11a, 11b of the line 11 can be supplied to the respective differential protective device 12a and 12b via this communications network 16, that is to say, in each differential protective device 12a and 12b, certain charge values are compared with one another in each case at both ends 11a and 11b for each phase of the line 11.

Based on the charge values from both ends 11a and 11b of the line 11 available in both differential protective devices 12a and 12b, for each phase a sum charge value can be formed and compared with a charge threshold value in one or both differential protective devices 12a and 12b by means of the evaluation device by addition of the charge values with the correct mathematical sign and subsequent absolute value formation.

In the case of a fault-free line 11, the amount of charge entering the line 11 for each phase is equal to the amount of charge leaving the line 11, with the result that a value with the absolute value of approximately zero would have to result from the addition with the correct mathematical sign of the charge values.

If the sum charge value exceeds the prescribed charge threshold value for a certain phase, this indicates an internal fault with respect to the relevant phase of the line 11, where the fault may be, for example, a short that involves ground or a two-pole or multi-pole short, that is to say a short between two or more phases of the line 11. The differential protective devices 12a and 12b generate a fault signal for the phase in which the fault has been identified, as a result of which the emission of a tripping signal to circuit breakers (not shown in FIG. 1) that can be switched in a phase-selective manner is effected via control lines. The tripping signal causes the corresponding phase-related circuit breaker to open its switching contacts so that the phase that is affected by the fault is isolated from the rest of the energy supply network.

FIG. 1 shows by way of example an external fault 17. The fault is not located on the monitored line 11 and therefore does not have to be disconnected by the differential protective devices 12a and 12b. This is achieved in the charge differential protection by virtue of the fact that the charge sum is below the observed charge threshold value since the amount of charge flowing into the line 11 corresponds to the amount of charge flowing out of the line 11.

For the case that at least one of the current transformers 14a, 14b falls into a saturation state, however, the current signal can no longer be generated correctly from the current arising on the primary side, with the result that a significant error occurs during the ascertainment of the corresponding charge value.

In FIG. 1, it is assumed, for example, that the measurement using current transformer 14a is adversely affected by saturation. A corresponding profile of the current signal generated is shown in graph 15a. In this graph 15a, the profile of the current signal generated on the secondary side by the current transformer 14a is shown in a solid line. For comparison, the profile of the current signal without transformer saturation is indicated in a dashed line.

In graph 15b, the profile of the current signal emitted on the secondary side by the current transformer 14b is shown. The current transformer 14b is not adversely affected by transformer saturation, with the result that the current profile generated correctly reflects the current present on the primary side.

Graph 15c illustrates the profile of the difference between the two current profiles to demonstrate the fault that is produced by the distorted measurement by the current transformer 14a. For the case of an external fault present here, it is identified that a significant difference current arises. In a corresponding manner, the charge value generated from the current measurement values is afflicted with faults due to the distorted measurement by the current transformer 14a, with the result that an internal fault is identified during a comparison of the charge sum with the charge threshold value. This causes an undesired disconnection of the line.

Figure 2:
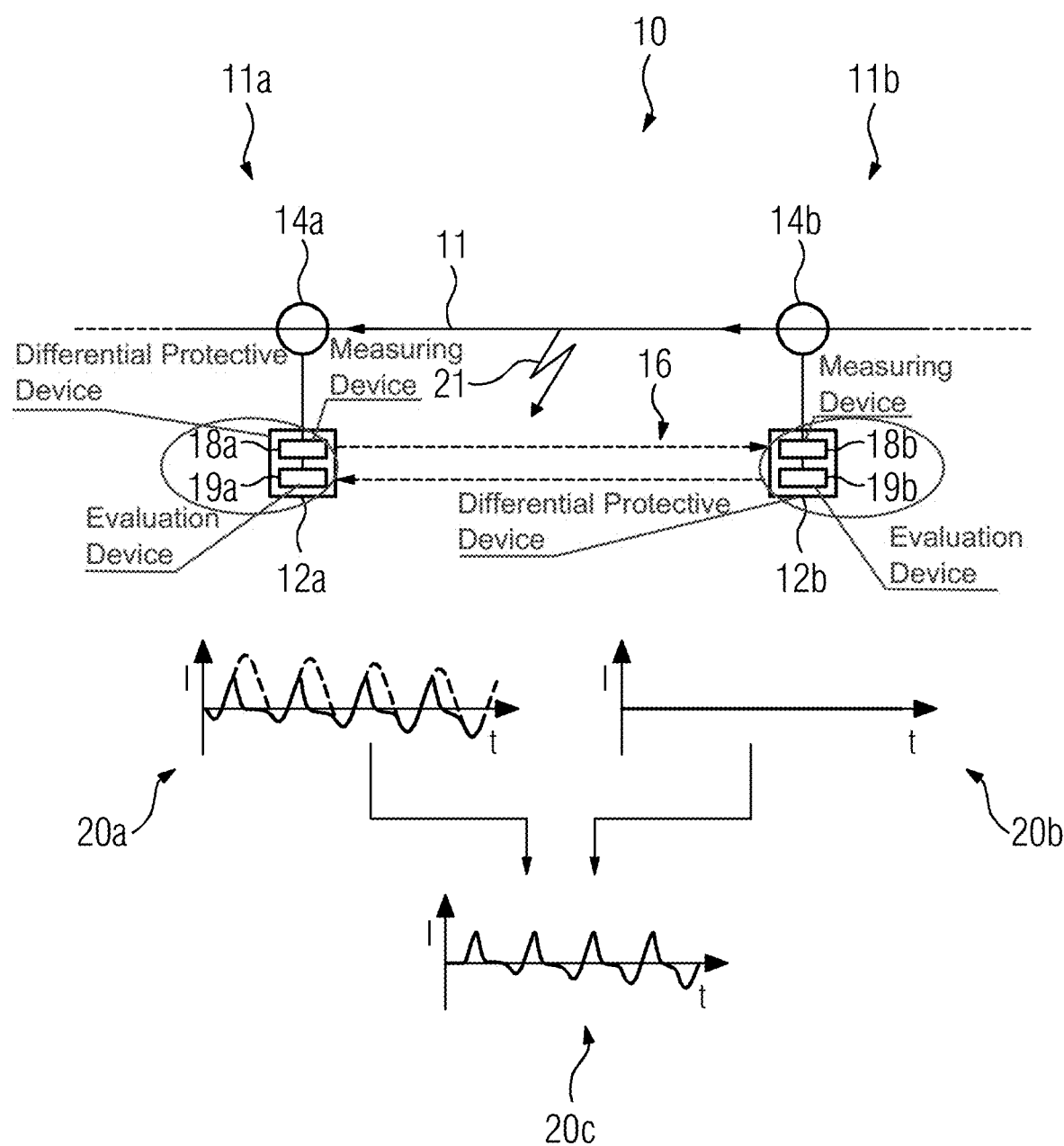
FIG. 2 is an illustration of a differential protective system in the event of a measurement disturbed by transformer saturation in the case of an internal fault.

FIG. 2 shows the differential protective system of FIG. 1 in the case of an internal fault 21. The internal fault has to be identified as such by the differential protective devices 12a, 12b and disconnected. In the case of an internal fault, the currents flowing at both line ends—and accordingly also the amounts of charge—do not correspond since a fault current also flows through the fault location. An internal fault can thus be identified through appropriate comparison of the amounts of charge determined for the ends. In the case of transformer saturation being present, at least one current signal is disturbed again. FIG. 2 shows this by way of example in graph 20a for current transformer 14a. Graph 20b shows the current signal generated using current transformer 14b. Since no current flows at the end 11b of the line in the case of single-side feeding on account of the fault 21, a profile with the value of zero is detected here. In graph 20c, the profile of the current difference is identified. On account of the saturation of the current transformer 14a, the current peaks are formed as significantly lower than if this had been the case in the absence of transformer saturation. The same applies to the charge values formed using the current signals of the transformers 14a, 14b. In the worst case, therefore, an internal fault is not identified and disconnected during the comparison of the charge sum with a charge threshold value.

In order to nevertheless be able to make a reliable decision about the presence of an internal or external fault even in the case of transformer saturation being present, the distortion of the current signal caused by transformer saturation is compensated by forming estimated charge values during formation of the charge value.

Figure 3:
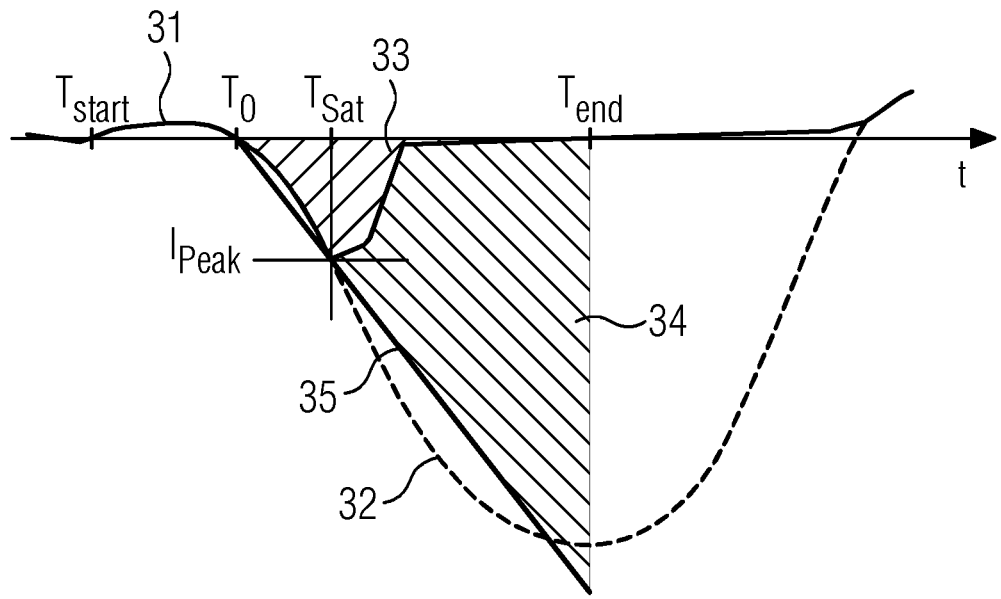
FIG. 3 is a signal profile a first example of a formation of an estimated charge value.

An exemplary embodiment for forming an estimated charge value is illustrated in FIG. 3. FIG. 3 shows a profile 31 of the current signal emitted on the secondary side by a current transformer. Transformer saturation starts at the time $T_{Sat}$ and the further profile of the current signal deviates significantly from the expected profile 32, which is shown in FIG. 3 as a dashed line. Through integration of the current measurement values prescribed by the current profile 31, the value of the area 33 shown in FIG. 3 would result as the charge value, which value of the area is significantly lower than the amount of charge that actually flowed.

The amount of charge that flowed is therefore estimated by means of an estimated charge value. In the case of FIG. 3, the estimated charge value is generated using only a few points on the profile 31 of the measured current signal. For a start, the time $T_{Sat}$ of the onset of the transformer saturation is required. The time can be identified, for example, by virtue of the fact that the actual current profile 31 deviates significantly from the expected current profile 32 for the first time at this time. The expected current profile 32 is produced, for example, from the behavior of the current profile a whole number of periods in advance, wherein DC components and/or subsiding elements can be taken into account, where necessary. At the time $T_{Sat}$, the peak current $I_{Peak}$ present there is ascertained. The time $T_0$ of the last zero crossing of the current profile 31 is also required. The time can be taken from the measurement—possibly by interpolation. A straight line 35 with the straight-line equation $$I_{est}(t) = \Delta I \cdot t + I_0 = \frac{I_{Peak}}{T_{Sat} - T_0} \cdot t + I_0$$

can be determined using these two points on the profile 31. The straight line 35 approximately has the gradient of the profile 31 at the time $T_{Sat}$ of the onset of current transformer saturation. The value $I_{est}(T)$ that can now be calculated describes an estimated current (est=estimated) on the straight line 35, which is obtained by the straight-line equation. To form the estimated charge value $Q_{est}$ in the time range $T_{start}$ to $T_{end}$, the estimated current measurement values $I_{est}(t)$ that can be determined by the straight-line equation are integrated:

$$Q_{est}(t) = \int_{T_{start}}^{T_{end}} I_{est}(t)dt = 0.5 \cdot \Delta I \cdot (T_{end}^2 - T_{start}^2).$$

To put it clearly, the value of the amount of charge that flowed within the time interval $T_{end}$-$T_{start}$ is thus determined as the sum of the two area components 33 and 34. It is identified that, through the use of the straight lines, the estimated charge value can be adjusted relatively well to the amount of charge that would have been determined without transformer saturation.

This procedure of forming an estimated charge value is suitable, in particular, in cases in which the transformer saturation starts as early as very early after the zero crossing of the current profile.

Figure 4:
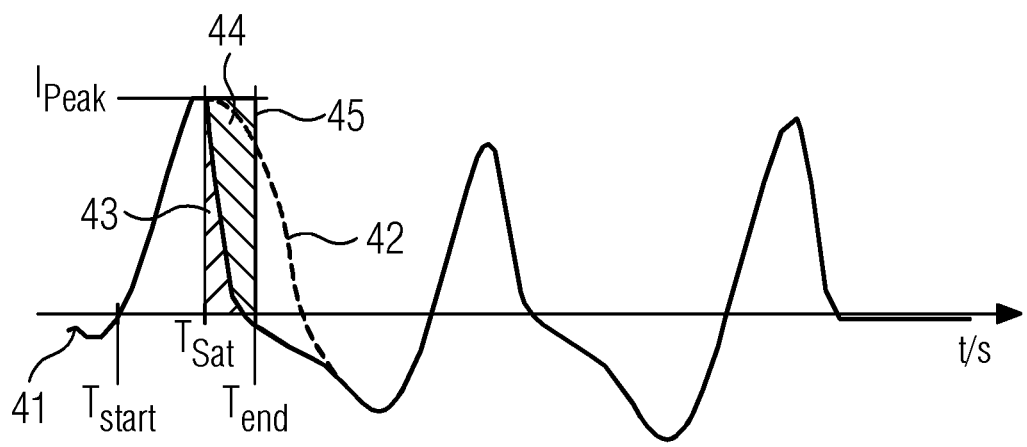
FIG. 4 is a signal profile of a second example of the formation of the estimated charge value.

FIG. 4 illustrates an alternative for determining an estimated charge value. In this case, the amount of charge is estimated by means of a rectangle 45. To this end, the peak value $I_{Peak}$ of the current profile 41 at the time $T_{Sat}$ of the onset of the saturation is again required. This time can again be identified where the first significant deviation between the measured current profile 41 and the expected profile 42 occurs. A rectangle 45, one edge length of which corresponds to the level of the peak current $I_{Peak}$, is generated at this time. The other edge length is determined by the duration of the time interval $T_{end}$-$T_{sat}$. It is identified that, without compensation of the current transformer saturation, the amount of charge would have been determined as an area 43 with a significantly too small value, whereas the sum of the areas 43 and 44 clearly approximate the actual amount of charge.

Since, owing to the formation of the estimated charge value, in each case values, which although they approximate the actual value, they do not fully correctly assume them, are used in the formation of the charge sum, a temporarily increased charge threshold value is to be advantageously used for the decision about the presence of an internal fault in cases of identified transformer saturation.

Figure 5:
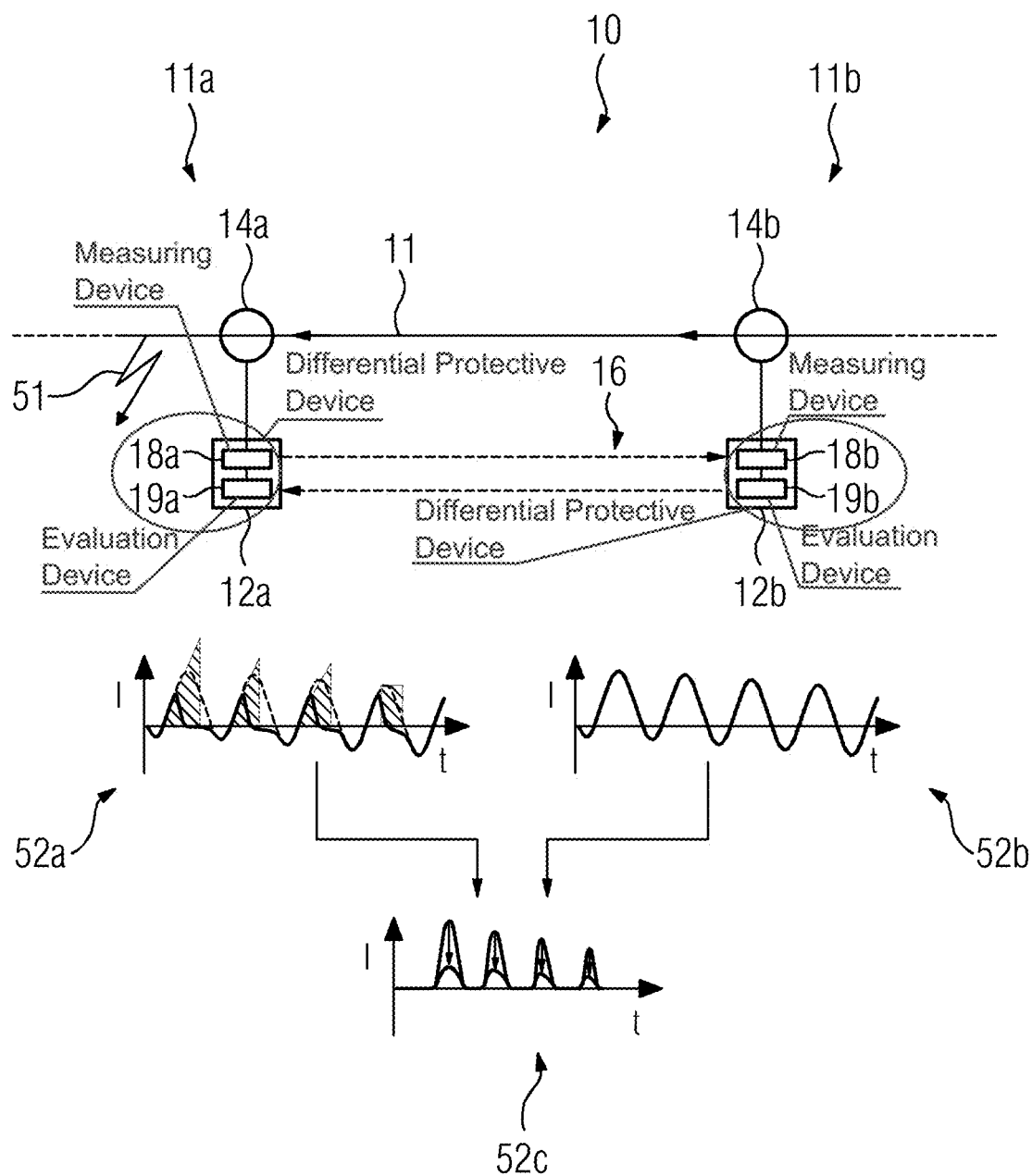
FIG. 5 is an illustration of the differential protective system in the event of a measurement disturbed by transformer saturation in the case of an external fault with compensation through use of an estimated charge value.

FIGS. 5 and 6 show the differential protective system of FIGS. 1 and 2 for the cases of an external fault 51 (FIG. 5) and an internal fault 61 (FIG. 6). In each case, current transformer saturation of the current transformer 14a is assumed again.

FIG. 5 illustrates current profiles of the current transformers 14a, 14b in graphs 52a, 52b. The profile of the difference current is indicated in graph 52c. In the present external faults, the use of the estimated charge value (see graph 52a) produces a significant reduction in the difference charge (indicated by arrows in graph 52c), whereby the likelihood of faulty tripping is greatly reduced.

FIG. 6 illustrates current profiles of the current transformers 14a, 14b in graphs 62a, 62b. The profile of the difference current is indicated in graph 62c. In the present internal faults, the use of the estimated charge value (see graph 62a) produces a significant increase in the difference charge (indicated by arrows in graph 62c), whereby the likelihood of the identification of the internal fault is increased.

The charge threshold value used can be set as a separate parameter or as a characteristic curve in a tripping diagram.

Although a line 11 having only two ends 11a and 11b, respectively, is shown in accordance with FIGS. 1, 2, 5 and 6, the inventive method can also be used in any desired single-phase or multi-phase lines having two or more ends, for example electrical busbars having a plurality of branches.

Moreover, as a deviation from the illustration in FIG. 1, there may also be provision for the current measurement values to be transmitted to a single differential protective device and evaluated there. In this case, it is sufficient to place measuring devices at the ends 11a, 11b of the line 11, which measuring devices detect the current measurement values and transmit them to the differential protective device. This differential protective device could be arranged at one of the line ends, but also at any other location, for example as a central differential protective device in a switchgear station or a control center.

In the described differential protection method, a lost piece of information about the profile of the current signal is thus virtually regained after onset of the current transformer saturation in a very simple manner, with the result that measures for excess stabilization with respect to measurement errors up to blocking of the measurement can be avoided.

In other words, the described method uses the temporal current integral instead of the instantaneous values or phasors of the currents. According to the invention, the temporal current integral is not obtained through the reconstruction of the individual instantaneous values but through an equivalent area. Since this equivalent area is afflicted with faults due to its simplicity, it is rated with a correspondingly higher stabilization contribution.

Although the invention has been illustrated and described in more detail above by preferred exemplary embodiments, the invention is not restricted by the disclosed examples and other variations can be derived herefrom by a person skilled in the art without departing from the scope of protection of the subsequent patent claims.

The invention claimed is:

1. A differential protection method for monitoring a line of an electrical energy supply network, which comprises the steps of:
generating current signals at ends of the line using inductive current transformers, the current signals being proportional to a current flowing at a respective end of said ends;
forming, for each said respective end, current measurement values from a respective current signal using measuring devices, the current measurement values indicating a profile of the current flowing at the respective end;
with at least one evaluation device, determining for each said respective end, a respective charge value from the current measurement values;
with the at least one evaluation device, summing charge values of all the ends with a correct mathematical sign so as to form a charge sum;
with the at least one evaluation device, generating a fault signal that indicates an internal fault on the line when the charge sum exceeds a charge threshold value;
with the at least one evaluation device, identifying an estimated charge value using a corresponding measuring device when transformer saturation of a current transformer is present; and
with the at least one evaluation device, using the estimated charge value to form the charge sum;
wherein the at least one evaluation device is selected from the group consisting of a signal processor and a central processing unit.

2. The method according to claim 1, which further comprises, with the at least one evaluation device, forming a temporal integral over the current measurement values of the respective end of the line during a prescribed time interval to form the respective charge value.

3. The method according to claim 1, which further comprises, with the at least one evaluation device, identifying the estimated charge value using at least one current measurement value present at an onset time of the transformer saturation.

4. The method according to claim 3, which further comprises:
with the at least one evaluation device, determining a straight line that passes through the current measurement value at the onset time of the transformer saturation and through a last zero crossing of the current profile to ascertain the estimated charge value; and
with the at least one evaluation device, determining the estimated charge value as an area lying within a time interval between the straight line and a zero line.

5. The method according to claim 4, which further comprises:
with the at least one evaluation device, forming a rectangle to ascertain the estimated charge value, a first side of the rectangle is determined by the current measurement value at the onset time of the transformer saturation and a second side of the rectangle is determined by a duration of the time interval; and
with the at least one evaluation device, determining the estimated charge value as an area of the rectangle.

6. The method according to claim 3, which further comprises:
a difference value between a present current measurement value and a predicted value is determined, with the at least one evaluation device, to identify the onset time of the transformer saturation, wherein the predicted value indicates an expected profile of the current; and
the onset time is identified when the difference value exceeds a saturation threshold value.

7. The method according to claim 1, which further comprises, with the at least one evaluation device, temporarily increasing the charge threshold value when the transformer saturation is present.

8. A differential protective device for monitoring a line of an electrical energy supply network, the differential protective device comprising:
a measuring device configured to detect a current signal generated at an end of the line and to form current measurement values indicating a profile of a current flowing at a respective end, the current signal having been produced proportionally to the current flowing at the respective end using an inductive current transformer; and
an evaluation device configured to determine a charge value from the current measurement values, to sum charge values with a charge measurement value of at least one other differential protective device with a correct mathematical sign so as to form a charge sum and to generate a fault signal that indicates an internal fault on the line when the charge sum exceeds a charge threshold value, said evaluation device is configured, when transformer saturation of the inductive current transformer is present, to ascertain an estimated charge value and to use the estimated charge value to form the charge sum;

wherein said evaluation device is selected from the group consisting of a signal processor and a central processing unit.

* * * * *